United States Patent [19]
Bran

[11] Patent Number: 5,148,823
[45] Date of Patent: Sep. 22, 1992

[54] SINGLE CHAMBER MEGASONIC ENERGY CLEANER

[75] Inventor: Mario E. Bran, Garden Grove, Calif.

[73] Assignee: Verteg, Inc., Anaheim, Calif.

[21] Appl. No.: 598,909

[22] Filed: Oct. 16, 1990

[51] Int. Cl.⁵ .............................................. B08B 3/10
[52] U.S. Cl. .................................... 134/184; 134/186; 134/902
[58] Field of Search ................... 134/8, 902, 184, 186, 134/200, 76, 84, 91, 96, 98, 94, 95, 155; 18/355

[56] References Cited

U.S. PATENT DOCUMENTS

| | | |
|---|---|---|
| 4,543,130 | 9/1985 | Shwartzman . |
| 4,635,666 | 1/1987 | Daley et al. ...................... 134/902 X |
| 4,694,527 | 9/1987 | Yoshizawa ....................... 134/902 X |
| 4,804,007 | 2/1989 | Bran . |
| 4,841,581 | 6/1989 | Russell ................................. 134/186 |
| 4,854,337 | 8/1989 | Bunkenburg et al. . |
| 4,905,325 | 3/1990 | Colditz ............................ 134/166 R |
| 4,934,392 | 6/1990 | Henfrey ........................... 134/186 X |
| 4,997,490 | 3/1991 | Vetter ................................. 134/95 X |
| 4,998,549 | 3/1991 | Bran . |

FOREIGN PATENT DOCUMENTS

| | | | |
|---|---|---|---|
| 57-83036 | 5/1982 | Japan .................................... 134/902 |
| 1-246835 | 10/1989 | Japan .................................... 134/902 |

Primary Examiner—Frankie L. Stinson
Attorney, Agent, or Firm—Knobbe, Martens, Olson & Bear

[57] ABSTRACT

A cleaning system for semiconductor wafers wherein a megasonic energy cleaning system is utilized. Megasonic energy cleaning systems comprise a piezo-electric transducer and a transmitter. The transducer emits high frequency energy into the body of the transmitter. The transmitter radiates this energy into a container holding processing fluid. The energy causes the liquid to oscillate, thus vibrating contaminants off the surface of the wafer. The megasonic cleaning system is located atop a table which is mounted on a piston. In retracting the piston, the bottom of the container is removed any any liquid held within is dumped out into a second receptacle. The piston can then be returned to its extending position, and a rinsing agent can be added. Thus the megasonic cleaning system can be employed during the rinse cycle as well as the processing cycle, better cleaning the semiconductor wafer. The combination of the megasonic energy cleaning system with a dump valve provides for higher yield and superior purity in semiconductor processing. One version of the megasonic cleaning device is located in the lower part of a tank separate from the dump valve.

6 Claims, 5 Drawing Sheets

SINGLE CHAMBER MEGASONIC ENERGY CLEANER

FIELD OF THE INVENTION

The present invention relates to the processing semiconductor wafers. More particularly, the present invention relates to the removal of contaminants from semiconductor wafers and other substrates.

BACKGROUND OF THE INVENTION

Semiconductor devices operate by placing a plurality of regions of differently doped, semiconductive material adjacent one another. The purity of the constituent semiconductor materials, critically affects the current carrying characteristics of the device. This is especially true as integrated circuits, made of semiconductor devices, become smaller. In smaller devices, contaminating ions will deplete a greater percentage of device real estate. Thus, contamination is more detrimental to performance as devices get smaller. Therefore, the number of contaminants which adhere to the device during processing must be carefully controlled.

Integrated circuits, where many semiconductor devices are utilized collectively, are formed by depositing semiconducting materials on a substrate arranged such that a desired current flow is realized. Processing is typically done in a clean room, which is a self-contained room with strict regulations about the number of stray particles allowed in the air. However, it is impossible to ensure that a clean room is particle free. Although human operators wear protective clothing and filtering systems function continuously, debris is brought into the clean room each time an operator enters. Additionally, the human body naturally discharges particles, such as dead skin, further adding to clean room contamination. Thus, a clean room contains particles to which the semiconductor can be exposed and thereby become contaminated.

Another threat to the purity of semiconductor devices is inherent in their processing. Many types of semiconductor processing, including pre-diffusion cleaning of the wafer, etching, i.e., removal of material to form the desired layout, and photo-resist removal after etching is completed require the device to be exposed to liquids For example, a transistor in an integrated circuit has many layers of different materials. Fabrication requires an extremely clean substrate on which the dopant is diffused. Thus, the substrate must be cleaned prior to diffusion. Pre-diffusion cleaning requires the wafer to be exposed to liquid which cleans the substrate and liquid which rinses off the cleaner and stray contaminants.

During rinsing, contaminating particles can become attached to the wafer, seriously degrading the quality of the semiconductor device. Typically, the tanks containing liquid baths are exposed to the atmosphere of the clean room. As discussed before, a clean room is never totally uncontaminated. Contaminants fall to the surface of the bath liquids, where they remain until the bath is disturbed. As the wafer moves across the bath/air interface, contaminants that rest on the liquid's surface can stick to the wafer surface. This is especially problematic during removal of the wafer from the final rinse bath since, thereafter, the wafer is not cleaned again.

An additional problem faced in the processing of semiconductor wafers is the fact that as a bath ages, it receives more contaminants. Uniformity throughout batches is extremely important to ensure the reliability of a given semiconductor device. A consumer of semiconductor devices expects that each time a given device is replaced it will function as well as the previous device did. Thus, it is important that each batch of wafers is identical. Since contaminants on the surface of a bath increase with the life of the bath, the first batch of wafers processed can be extremely different than the final batch of wafers processed before the fluid is discarded.

Further problems in semiconductor processing arise due to the handling of the devices. Typically, a device is dipped in a processing bath and then rinsed and moved to another bath. Contaminants, which can adhere to the device, can be generated by the transport machinery. Time spent in the air, between baths, allows contaminants present even in clean rooms to become attached to the device. Additionally, transport of the wafers often leads to breakage. Thus, it is advantageous to minimize wafer movement and, hence, the risk of damage. Furthermore, the machinery required to mechanically move a wafer from one bath to another can be quite expensive.

To eliminate some of the above discussed problems associated with semiconductor processing, several systems have been employed. One, a megasonic cleaning apparatus, is disclosed in U.S. Pat. No. 4,869,278 to Bran. This apparatus uses high frequency energy to agitate a cleaning solution, thereby enabling the agitating liquid to loosen particles on the surfaces of semiconductor wafers. A transducer is aligned beneath a transmitter at the bottom of a bath container. The transducer is electrically excited at its resonant frequency and the transmitter couples the vibrational energy into the bath fluid. The bath liquid vibrates at the frequency output by the transducer. Contaminants are thus shaken loose from the surface of the wafer.

The megasonic process is similar to ultrasound, where sound waves vibrate a bath of liquid to clean objects. However, high frequency oscillation is necessary to ensure that random sonic waves typically generated in liquids oscillating at ultrasound frequencies of approximately 20 to 40 kHz do not form. These sonic waves cause tiny cavities in the bath which implode and damage the wafer. Higher frequency vibration does not generate these types of cavities in vibrating liquid. Thus, megasonic, or high frequency, vibration is preferable in semiconductor processing.

One partial solution to minimize contamination and to accelerate the overall process has been to utilize a dump valve in rinsing tanks wherein a large valve in the bottom of the tank is opened to quickly empty the tank. A further processing or drying cycle can then quickly commence.

Another device which attempts to overcome contamination in processing semiconductor devices is disclosed in U.S. Pat. Nos. 4,633,893; 4,795,497; 4,856,544 and 4,899,767 to McConnell, et al. This device has a chamber wherein wafers are held in a cassette and fluids continuously flow over the faces of the wafers to process them. This allows the wafers to remain stationary as different baths continuously pass over them, and no machinery is necessary to move the wafers from one bath to another. Additionally, a uniform flow of liquid covers the wafer at all times during its processing such that the wafer is not exposed to the atmosphere of the clean room where it can be contaminated. Thus, this device overcomes some of the previously discussed problems associated with contamination and the possibility of damage to the wafer. However, the liquid near the surface of the wafer simply flows across the surface, removing loose contaminants. If a contaminating particle is substantially stuck to the surface of the wafer, this system may not reliably clean contaminants from the wafer. Also, the system is somewhat complicated and costly.

Thus, a further need exists for a device which allows the use of an improved cleaning system to remove particles stuck to the surface of a wafer without necessitating movement of the wafers during cleaning.

SUMMARY OF THE INVENTION

The present invention comprises a container for the wet processing of semiconductor devices. The container employs a megasonic, or high frequency, cleaning system. Additionally, a mechanism which allows rapid disposal of a first bath held in the container such that another bath or rinse can almost instantaneously enter the chamber is utilized. Thus, both processing and rinsing can be completed in a single chamber. This reduction in the number of containers necessary for processing can reduce the footprint of a cleaning device. Thus, less valuable space in a clean room is devoted to a single instrument. Additionally, the wafers need not be moved during wet processing, minimizing the possibility of contamination at an air/liquid interface. Furthermore, the possibility of wafer damage during transport is diminished. The present invention maximizes cleaning by utilizing megasonic technology during each wet processing cycle, i.e., cleaning and rinsing, while at the same time minimizing risk of damage to the wafers by enabling wet processing of the wafers to be completed in a single container.

DETAILED DESCRIPTION OF THE INVENTION

Figure 1:
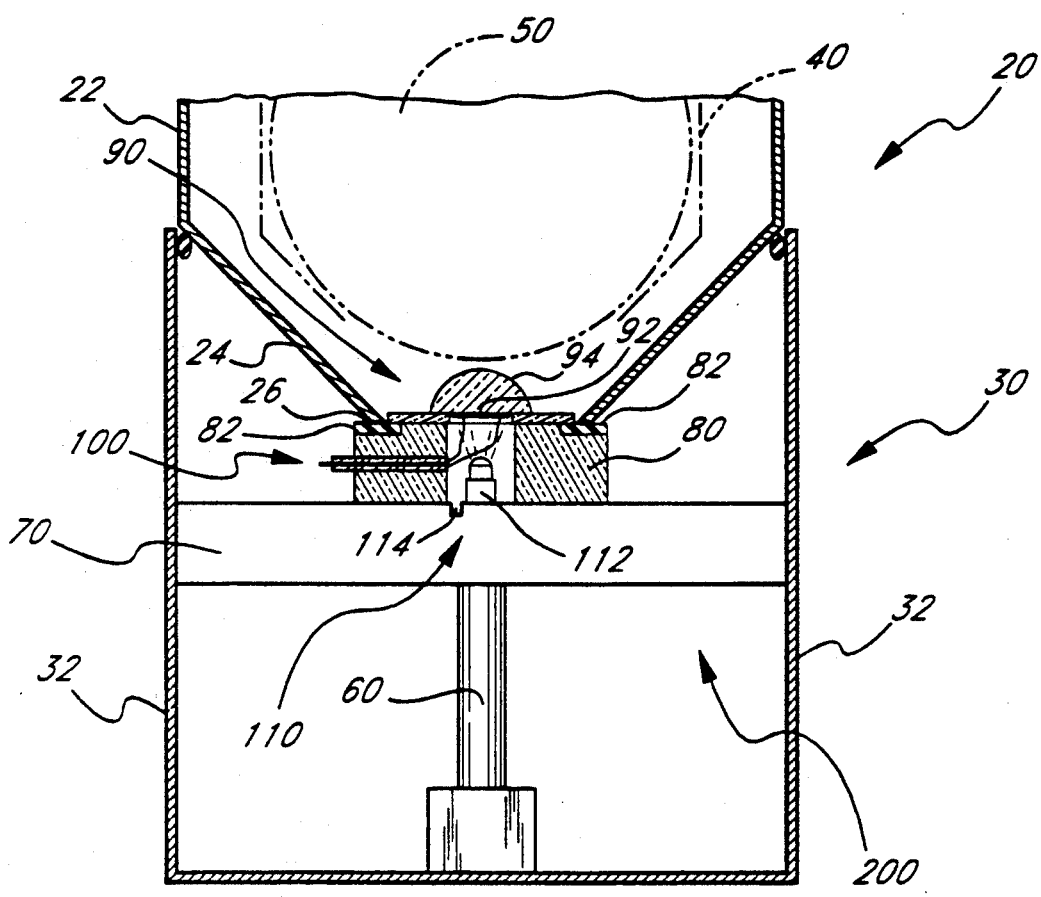
FIG. 1 is a schematic, cross-sectional end view of a first embodiment of the present invention illustrating the megasonic cleaning system mounted on a dump valve at the bottom of the wet processing tank.

FIG. 1 shows a wet processing tank or container 20 having an angular U-shape cross section supported at the top of a second receptacle 30 having a generally rectangular shape. The upper portions 22 of the sidewalls of the tank 20 are generally parallel and the lower portions 24 angle inwardly, meeting a bottom portion 26 of the container 20. The container 20 holds a cleaning liquid, introduced via an open top, or by way of valves, inlets or ports near the bottom.

A conventional cassette 40 filled with a plurality of semiconductor wafers 50 is submerged in this liquid. The cassette 40 is typically rectangular in both longitudinal and lateral cross section. The cassette 40 has an open top and an open bottom. Slots, aligned parallel to the lateral cross section of the cassette, are formed on the inner surface of the cassette. A single, vertically oriented wafer 50 is cradled in each slot. The cassette 40 of wafers 50 is inserted into the wet processing container 20 through the container's open top. Only one wafer is illustrated in the figure. Each of the other wafers are aligned in slots behind the one shown.

The angular shape of the wet processing container 20 conserves expensive cleaning fluid with respect to a generally rectangular container. The angled bottom portions of the wet processing container sidewalls 24 contact the bottom edge of the cassette 40 above the bottom wall 26 of the container 20, enabling cleaning fluid to circulate beneath the cassette 40 without wasting cleaning fluid to fill corners which would occur in a rectangular container. Alternatively, the cassette can be suspended from the container top.

The second receptacle 30 has walls 32 spaced as far as the sidewalls 22 of the tank 20. However, the sidewalls 32 need only be spaced far enough to capture any liquid which could exit the angled wet processing container 20 from its bottom 26. A pneumatic piston 60 is mounted at the center of this second receptacle 30. Atop the piston 60 rests a table 70. Mounted on the table 70 is a base 80 which surrounds and supports a megasonic cleaning system 90. The base 80 forms a part of the bottom wall 26 of the container 20 and becomes a movable valve member. The edges of the base 80 incorporate a suitable flat sealing gasket 82 which extends from the edge of the base 80 toward the center of the base 80 a distance at least as great as the cross sectional width of the bottom portion of the wet processing container's angled sidewalls 24. Thus, when the piston 60 is extended, the base 80 and the bottom portions of the wet processing container sidewalls 26 are mated and sealed such that the wet processing container 20 does not leak.

Figure 2:
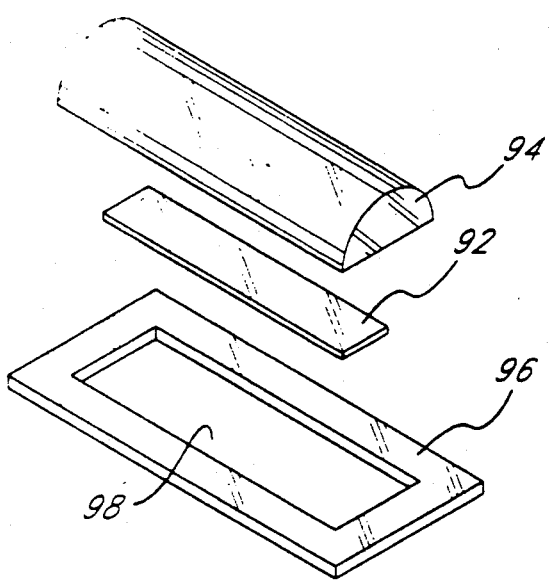
FIG. 2 shows an exploded view of one particular transducer, transmitter, and transducer support combination.

The megasonic cleaning system 90 is enclosed and supported by the base 80 such that when the piston 60 is extended, the megasonic system 90 is retained within the confines of the wet processing tank 20. Thus, the megasonic cleaning system 90 is a part of the bottom wall 26 of the wet processing container 20. The megasonic energy cleaning system 90 comprises a piezo-electric transducer 92 and a semi-cylindrical transmitter 94. The transmitter 94 is mounted on and fused to a generally rectangular support 96 having a generally rectangular orifice 98 forming a large portion of the center. A perspective exploded view of this arrangement is shown in FIG. 2. The transmitter 94 and its support 96 are typically made of the same material, for example, sapphire or quartz. However, the two can be manufactured of any materials suitable for their purpose. The convex side of the semi-cylindrical transmitter 94 faces the inside of the wet processing container 20. The piezoelectric transducer 92 is bonded to the underside of the semi-cylindrical transmitter 94 using an adhesive. The transducer 92 is located within the orifice 98 in the center of the transmitter's support 96. Thus, the transducer 92 is shielded from the liquid inside the wet processing tank 20 by the transmitter 94 and its support 96. The transducer 92 operates by placing a voltage across it, and obvious electrical precautions prohibit its exposure to liquid.

Figure 3:
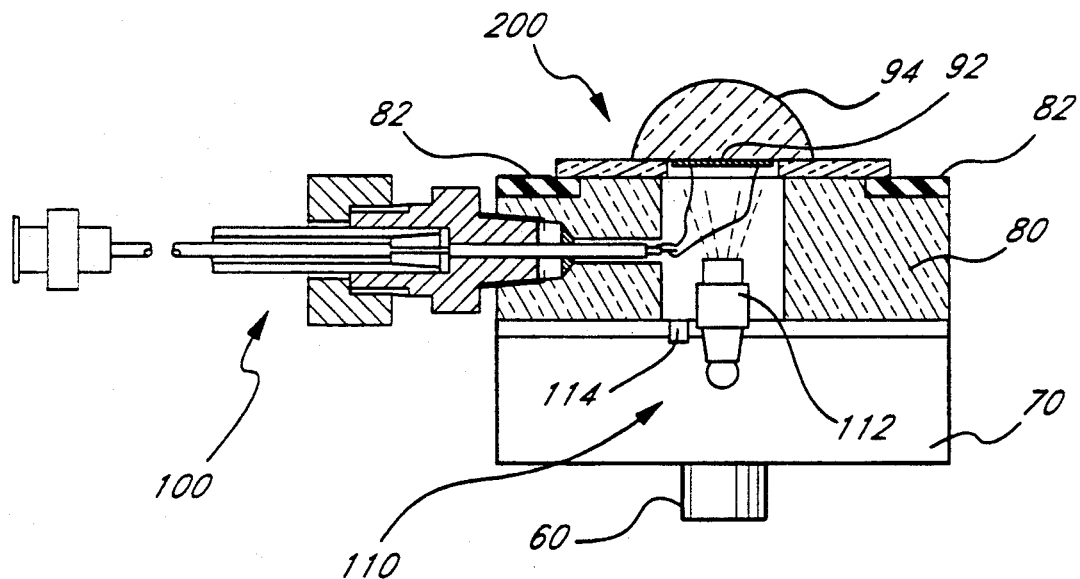
FIGS. 3 shows an enlarged view of the megasonic cleaning system for use in the first embodiment of the present invention.

The transmitter 94 and its support 96 fit inside the opening formed by the lower ends of the side wall portions 24. The longitudinal axis of the transmitter 94 is aligned with the longitudinal axis of the wet processing container 20. The walls of the base 80, the transmitter 94 and its support 96 on top of the base 80, and the table 70 which rests below the base 80 form a box which encloses the transducer 92, as seen in FIG. 3.

Figure 4:
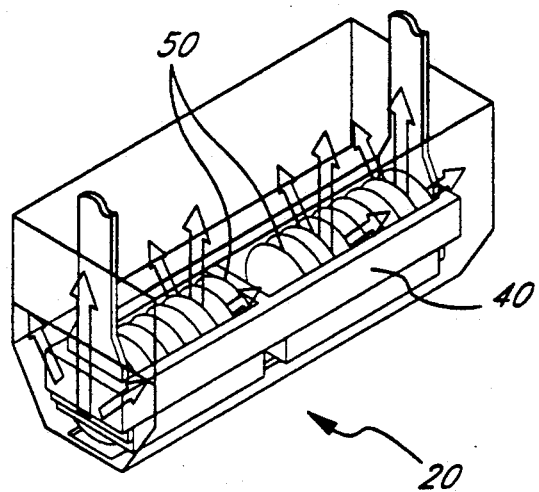
FIG. 4 shows a schematic perspective view of the effect of the transducer and transmitter combination shown in FIG. 2 on the liquid in a container.

The transducer 92 is energized by an electrical system 100 extending through one of the base 80 sidewalls. Sufficient voltage across the transducer 92 causes it to vibrate. This vibrational energy is transferred to the transmitter 94. Since the transducer 92 is flat, the oscillatory energy created as it vibrates is directed in a predominantly vertical orientation. The curved shape of the transmitter 94 causes this oscillatory energy to diverge in the cleaning liquid, radially away from the transmitter 94, creating vibrations in the liquid in a fan shape. The wafer cassette 40 is positioned in the wet processing container 20 such that the fan shaped section of agitating cleaning fluid which reaches the wafers 50 covers each surface of the wafers 50. Thus, the cleaning liquid is agitated generally parallel to, and across the entire surface of, the wafer 50. This is schematically shown in FIG. 4.

As the piezo-electric transducer 92 vibrates to agitate the cleaning liquid in the angled container, the transducer 92 tends to become warm. Extended use of the transducer 92 may cause overheating. Thus, a cooling system 110 comprising one or more nozzles 112, only one is shown, and a drain 114 is installed through the table 70 which forms the bottom of the box which houses the transducer 92. The nozzle 112 sprays coolant over the surface of the transducer 92 to prevent it from overheating as voltage is applied. The drain 114 allows the coolant to exit the box area. The nozzle 112 and drain 114 are shown severed in each of the figures which displays the megasonic cleaning system 90.

Figure 5:
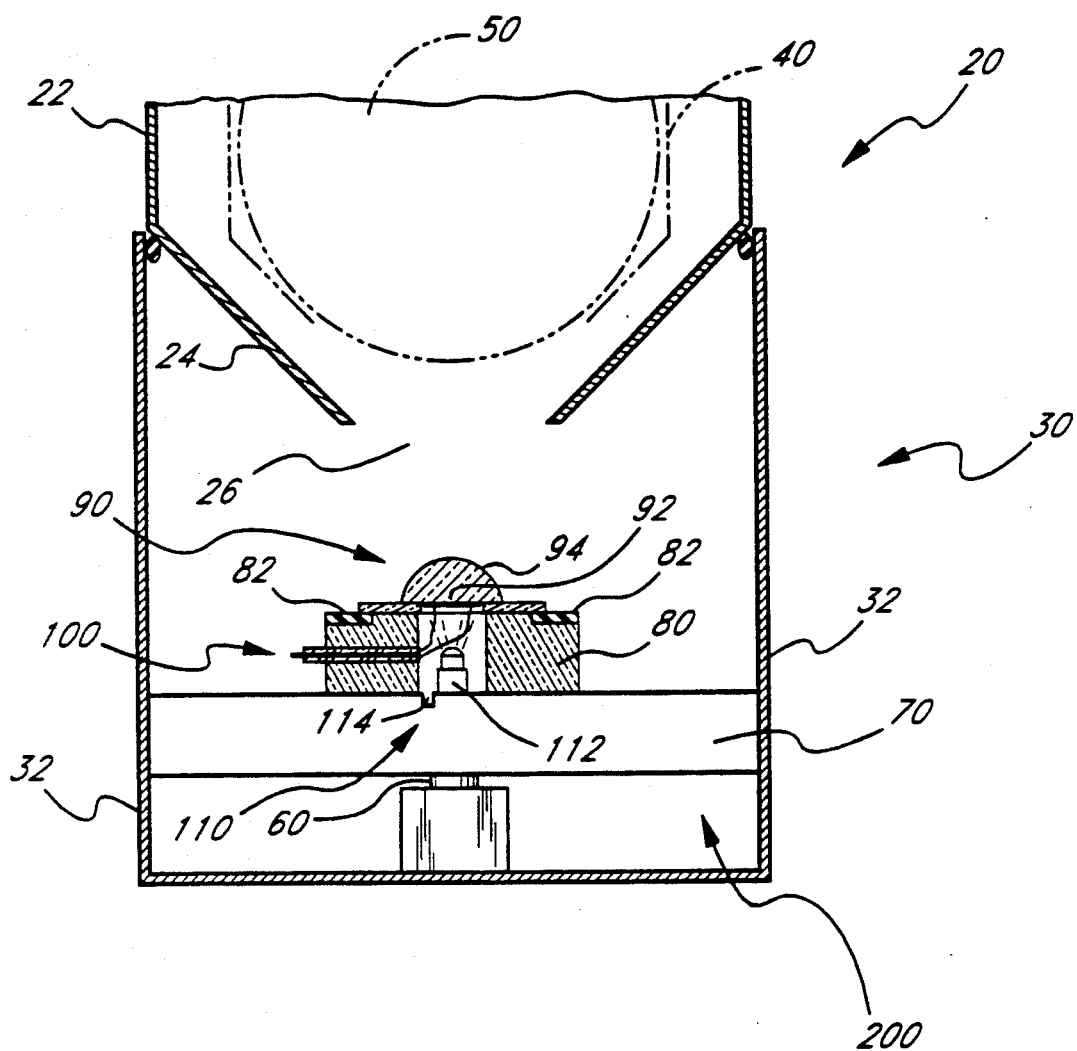
FIG. 5 is a schematic, cross-sectional end view of the first embodiment of the present invention, as in FIG. 1, having the dump valve open to dump cleaning fluids into a second receptacle.

When the processing requiring cleaning fluid is complete, the piston 60 is retracted, as shown in FIG. 5. This lowers the base 80 from the bottom of the container 20, thereby dumping the liquid contents of the container 20 into the second receptacle 30. When activated, the piston 60 retracts very quickly, opening a large orifice at the bottom 26 of the wet processing container 20, and causing quick dumping of the liquid. Hence, this type of valve system is typically called a dump valve 200.

The speed with which the dump valve 200 operates provides for remarkably clean wafers produced using a processing system of the present invention. Almost instantaneously, the cleaning fluid is removed from the wet processing container, carrying the contaminants with it. Quick removal coupled with quick refilling minimizes the exposure to air, although the wafers are also preferably sprayed from above during the dumping cycle to keep the wafers wet.

After the cleaning fluid has been dumped, the piston 60 is re-extended to its original position, re-sealing the bottom 26 of the wet processing tank 20. A rinsing agent is introduced to the container 20 to rinse the cleaning chemicals and contaminating particles off of the surfaces of the semiconductor wafers 50 in the cassette 40. Since the cleaning liquid was dumped into the second receptacle 30, the present invention allows the wafer cassette 40 to remain in the original container 20 during the rinsing process instead of being moved to a separate rinsing tank. Thus, the cleaning benefits of the megasonic cleaning system 90 are realized in the rinsing process as well. Exploitation of the megasonic energy cleaning system 90 in the rinse cycle greatly improves the quality of the wafers 50. First, it reduces the amount of contamination on the wafer 50 surfaces. Particles which may not have been removed when the cleaning liquid was dumped out of the container 20 are now agitated away from the surface of the wafer 50. Additionally, since the cassette 40 remains in the same container 20 for rinsing, machinery to move the cassette 40 to a separate rinsing container is unnecessary. Thus, fewer particles are generated by the cleaning machinery. Furthermore, the reduction in mechanical apparatuses reduces the cost of manufacturing semiconductor cleaning systems. Moreover, by retaining the wafers 50 in a single wet processing tank 20, the possibility of damage during transport from a first cleaning tank to a second rinsing tank is removed.

Upon completion of the rinsing process, the rinse liquid is dumped in the same manner as was the cleaning liquid. The cassette 40 is then transferred to a drying area. Since the rinse liquid has been dumped from the wet processing container 20, there is no liquid/air interface through which the wafers 50 must pass during their withdrawal from the top of the wet processing tank 20. Additionally, if extra rinsing is desired, new rinsing agent can be added to the container 20 prior to drying. Since the used rinsing agent has been dumped out of the container 20, there is no worry of wafer 50 contamination by already removed particles.

Another embodiment of the present invention is the addition of an overflow provision. This addition allows the processing of semiconductor wafers 50 to take place without dumping liquid until the cleaning and rinsing is complete. The overflow provision would allow liquids to overflow the top of the wet processing tank 20 and be drawn into various plumbing attachments A. This provision is illustrated schematically in FIG. 6.

Figure 6:
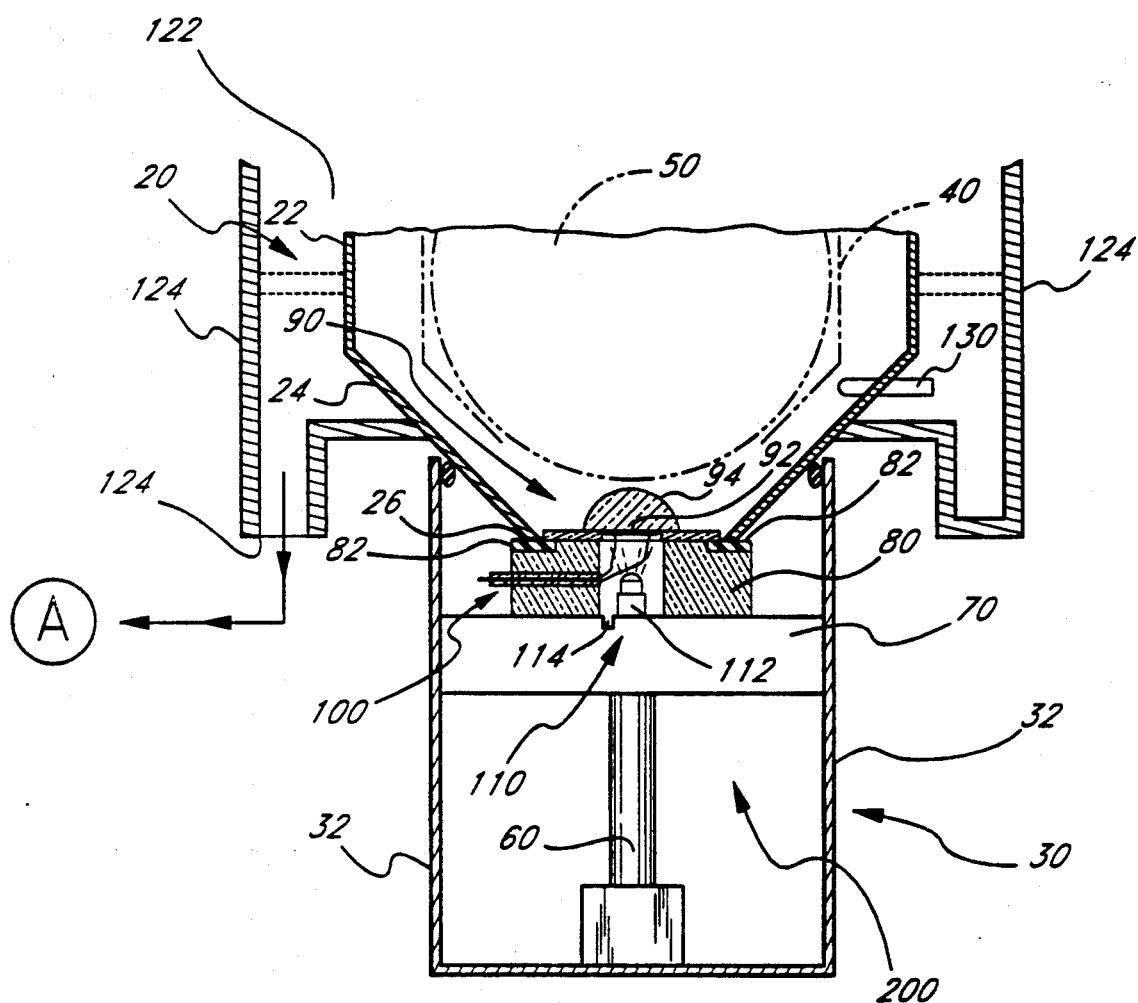
FIG. 6 is a schematic, cross-sectional end view of the system of the present invention further incorporating a third overflow tank, and a schematic illustration of a specialized plumbing system.

The overflow provision comprises a third liquid container 122 with sidewalls 124 constructed around the wet processing tank 20 of the present invention. FIG. 6 shows the floor 124 of the third container 122 connecting to the bottom, angled portion of the wet processing tank's sidewalls 24. However, the third container 122 can be of any configuration. The only limitation on its construction and arrangement with respect to the present invention is that any liquid overflowing from the wet processing tank 20 is caught by the third container 122.

In using the system of FIG. 6, a first solution is added to the tank 20, the megasonic cleaning system 90 is activated and the wafers 50 are cleaned using vibrational energy in the same manner as described previously. When this process is complete, instead of dumping the processing liquid, as described previously, deionized water is introduced into the wet processing tank through a valve 130 near the bottom of the tank 20, Causing the liquid in the tank 20 to overflow. The liquid will cascade into the third container 122 where a plumbing system, A, can either dispose of it or draw it into a chemical filtering and storage system. By continuing to add deionized water, all of the first chemical can be displaced from the wet processing tank 20 and replaced by deionized water.

When the tank 20 is full of deionized water, the valve 130 is shut to prohibit further overflow. The megasonic cleaning system 90 can remain activated during this liquid replacement and rinsing operation. When rinsing is complete, the rinse solution is dumped using the dump valve 200, as described previously. Thus, in the embodiment having an overflow provision, the megasonic energy cleaning system 90 can be utilized in both the cleaning and rinsing stages of wet processing while the wafer 50 is protected from exposure to the atmosphere of the clean room at all times during its wet processing. The use of the dump valve 200 to remove the rinse liquid from the wet processing container 20 eliminates the chance of contamination of the wafer 50 due to contact with a liquid/air interface. Additionally, the wafers 50 are maintained in one position during wet processing, reducing the chance of damage which could occur during transport.

The advanced system shown in FIG. 6 allows the use of more than one processing solution during wet processing of the wafers 50. The liquid which overflows into the third container 122 can either be discarded or routed to chemical storage and filtering tanks, A. The system can incorporate any number of chemical storage and filtering tanks A so long as a control system is also included. Another feature which may be added to the present invention is a heating system for wet processing which requires high temperatures, not shown.

Figure 7:
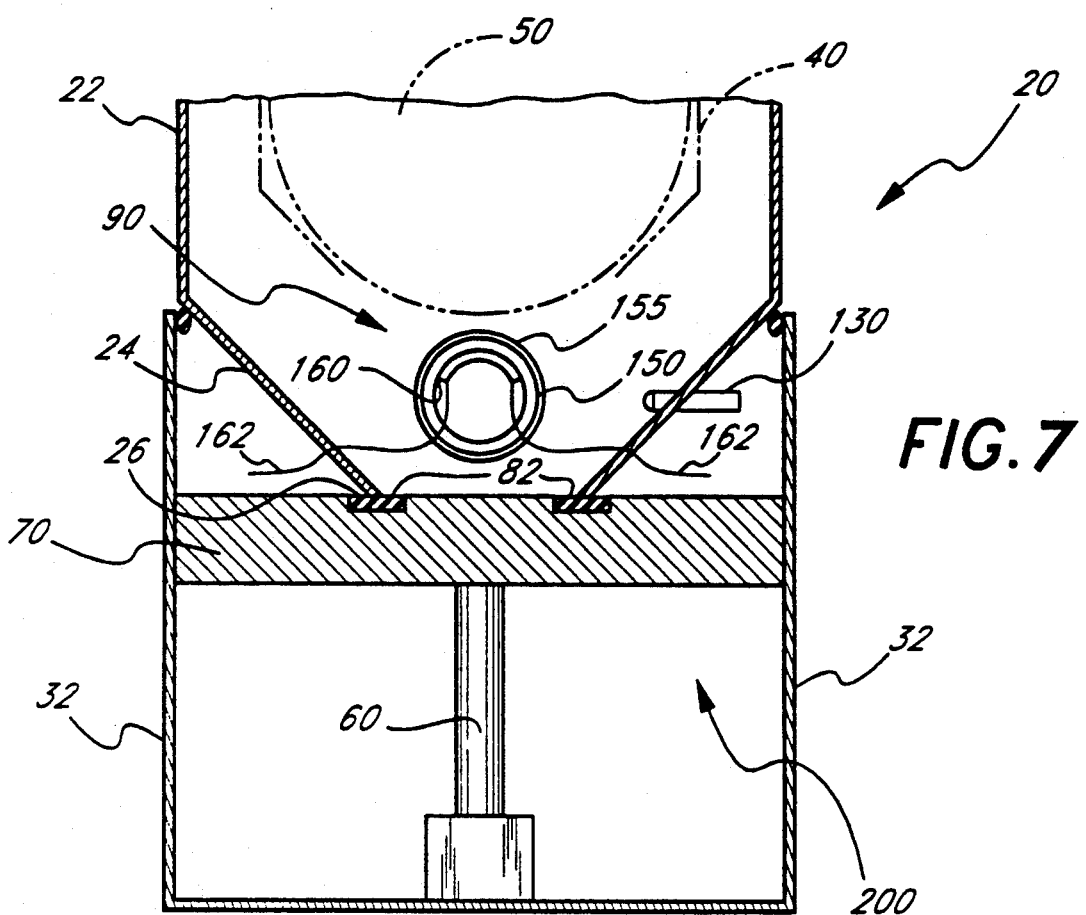
FIG. 7 shows a schematic, cross-sectional end view of another embodiment of the present invention illustrating the transducer of the megasonic cleaning system encased in a transmitting tube near the bottom of the wet processing tank and the dump valve beneath the tube.

Another embodiment of the present invention is shown in FIG. 7. A container 20, of the same shape as the container in FIG. 1, is again supported at the top of a second receptacle 30. The tank 20 holds a cleaning liquid and a cassette 40 filled with a plurality of semiconductor wafers 50, one wafer 50 of which is illustrated. A dump valve 200 at the bottom of the tank 20 includes a pneumatic piston 60 supporting a table or valve member 70 incorporating a generally rectangular gasket 82. The gasket 82 meets the bottom 26 of the wet processing container 20's walls and thereby seals the wet processing tank 20 closed.

Figure 8:
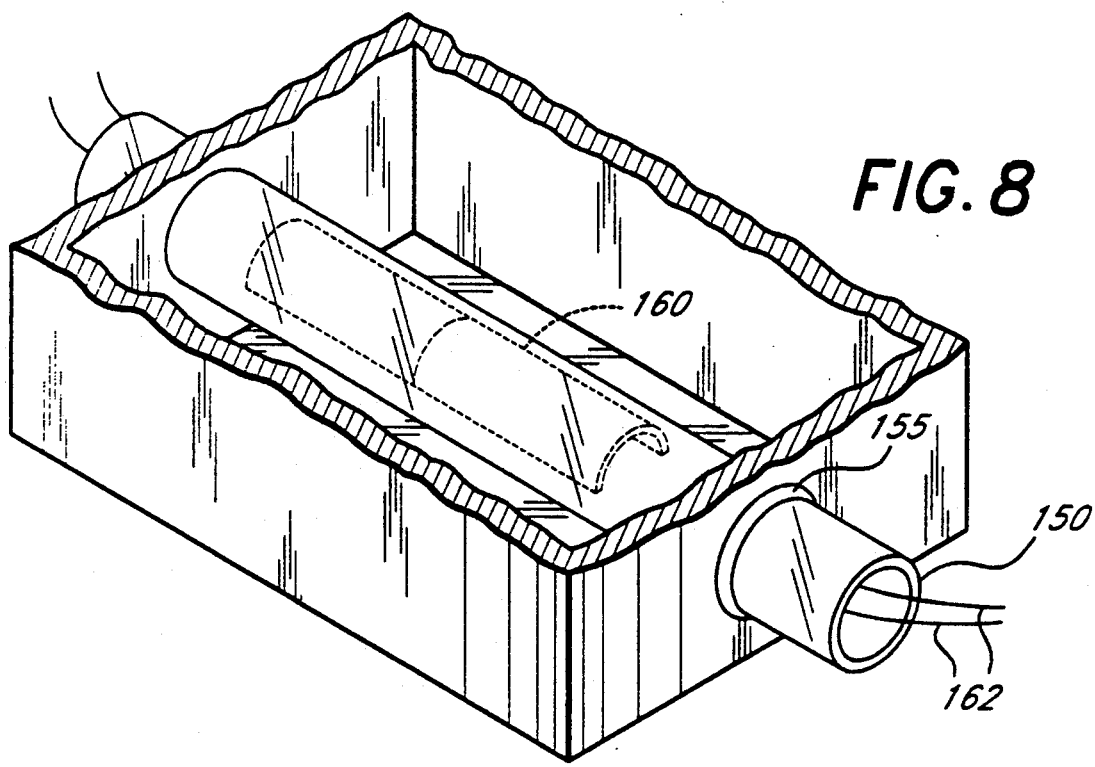
FIG. 8 is a perspective view illustrating how the transducer/transmitter combination shown in FIG. 7 is installed in a container. Note that the container is not representative of the wet processing tank used in the system of the second embodiment of the present invention.

The megasonic cleaning system 90 of the embodiment shown in FIG. 7 comprises a tubular transmitter 150 and a curved transducer 160. This is more fully described in U.S. patent application Ser. No. 272,501, filed Nov. 16, 1988. FIG. 8 illustrates a schematic perspective view of the tubular transmitter 150 and the curved transducer 160. Note, however, that the container is not representative of the container 20 of the present invention. The tube 150, made of quartz or sapphire for example, extends through the lower portion of the front and back facing sidewalls of the wet processing tank 20. The tube 150 is located in the tank such that its upper edges are in close proximity to the cassette 40 of wafers 50 when it is inserted into the container 20. The exterior of the tube 150 is sealed at 155 to the edges of holes in the container 20 such that no liquid can leak out of the container.

The tube 150 functions as a generally cylindrical transmitter. A piezo-electric transducer 160 is adhered along the interior of the top half of the transmitter tube 150. Two wires 162 extend from outside the tank 20, into the tube 150, where they are attached to provide energy for the transducer 160. No liquid can leak from the wet processing tank 20 into the tube 150 housing the transducer 160 and thereby cause electrical failure. If needed, a suitable cooling system can also be positioned within the tube 150 to spray coolant on the transducer 160.

A cassette 40 of wafers 50 is lowered into the wet processing container 20 which is full of cleaning fluid. Voltage is applied across the piezo-electric transducer 160 which causes it to vibrate. The vibrations of the curved transducer 160 emanate in a generally radial direction and are directed by the generally cylindrical transmitter 150. Thus, again, oscillatory energy is radiated in a radial direction away from the transmitter 150. Each surface of each of the wafers 50 is covered by vibrating cleaning fluid, wherein the vibration travels in a direction substantially parallel to the wafer 50 surfaces. After completion of the cleaning process, the piston 60 is quickly retracted, dumping the used liquid into the second receptacle 30. This embodiment of the present invention can of course incorporate the other provisions of the invention, as described previously.

Likewise, the transducer and transmitter concept of FIGS. 7 and 8 can be used with the arrangements of FIGS. 1–6. That is, the upper half of the tube 150 can be used with the curved transducer 160 to replace the flat transducer 92 and solid semi-cylindrical transmitter 94. A major advantage of the curved transducer is that the amount of energy supplied for a given width in the container is increased.

One skilled in the art will realize that any configuration of megasonic energy cleaner and wet processing container including a dump valve will achieve the desired results as long as the wafers are placed in close enough proximity to the transmitter of the megasonic cleaner. Thus, the present invention is not limited to the embodiments discussed above. Additionally, one skilled in the art will realize that any suitable materials may be employed for manufacture of parts for the system, including the wet processing container, the second receptacle, the dump valve, the transducer and transmitter, the cassette which holds the wafers, the third container and its accompanying plumbing, and the piston system. Further, one skilled in the art will realize that the second receptacle and third container can be of any size and shape, the only restriction being that they are able to receive the liquids dumped and overflowed, respectively, from the wet processing tank. Moreover, the wet processing tank can be of any size and shape, the only restriction being that a cassette of semiconductor wafers can be fully submerged in the liquid contained with the tank.

I claim:

1. An apparatus for cleaning semi-conductor wafers and the like, comprising:
   a tank for wafer-cleaning liquid and a wafer to be cleaned;
   a dump valve in the lower portion of the tank for quickly dumping liquid from the tank, said dump valve including a movable valve member; and
   a device for generating sonic energy positioned to agitate liquid in the tank to clean said wafer, said device being mounted to move with said member.

2. The apparatus of claim 1, wherein said member forms a substantial portion of the bottom wall of said tank.

3. The apparatus of claim 1, including an actuator supporting said member and said device to move the member with said device into open or closed positions with respect to said tank.

4. An apparatus for cleaning semi-conductor wafers and the like, comprising:
- a tank for wafer-cleaning liquid and a wafer to be cleaned;
- a dump valve in the lower portion of the tank for quickly dumping liquid from the tank; and
- a device for generating megasonic energy positioned to agitate liquid in the tank to clean said wafer;
- said tank having a bottom wall which forms a moveable valve member of said dump valve, and said device including a megasonic energy transducer vibrationally coupled to a megasonic energy transmitter which has a surface exposed to the interior of said tank;
- said container being sized to receive a cassette carrying a plurality of wafers arranged in spaced parallel relation and with the wafers extending generally vertically with respect to the bottom wall above said transmitter, said cassette being positioned to straddle the dump valve and said device, said transmitter extending beneath the area in which said cassette is to be positioned, whereby megasonic energy is transmitted across both faces of each wafer positioned in the cassette.

5. The apparatus of claim 4, wherein said transmitter has a convex surface facing the interior of said tank to transmit said megasonic energy in a diverging pattern that subtends substantially the entire diameter of each of said wafers.

6. An apparatus for cleaning semi-conductor wafers and the like, comprising:
- a tank for wafer-cleaning liquid and a wafer to be cleaned;
- a dump valve in the lower portion of the tank for quickly dumping liquid from the tank; and
- a device for generating megasonic energy positioned to agitate liquid in the tank to clean said wafer;
- said device including a tube extending from one side of said tank to an opposite side of said tank with the tube being joined to said tank sides such that the tube defines a tubular space that is in open communication with the exterior of the tank, while the exterior of the tube is exposed to the liquid in the tank, said device including a transducer bonded to the interior of said tube to transmit energy through a wall portion of said tube into the liquid within the tube, said tube being located in the lower portion of said tank and the above said dump valve so that one or more wafers may be positioned above said tube to be cleaned by liquid agitated by said megasonic energy, and the liquid may be quickly dumped from the tank by way of said valve.

* * * * *